(12) United States Patent
Li et al.

(10) Patent No.: US 11,967,482 B2
(45) Date of Patent: Apr. 23, 2024

(54) CHARGED PARTICLE BEAM DEVICE

(71) Applicant: Hitachi High-Tech Corporation, Tokyo (JP)

(72) Inventors: Wen Li, Tokyo (JP); Hajime Kawano, Tokyo (JP); Momoyo Enyama, Tokyo (JP); Makoto Sakakibara, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 413 days.

(21) Appl. No.: 17/435,118

(22) PCT Filed: Mar. 8, 2019

(86) PCT No.: PCT/JP2019/009527
§ 371 (c)(1),
(2) Date: Aug. 31, 2021

(87) PCT Pub. No.: WO2020/183551
PCT Pub. Date: Sep. 17, 2020

(65) Prior Publication Data
US 2022/0102105 A1    Mar. 31, 2022

(51) Int. Cl.
*H01J 37/153* (2006.01)
*H01J 37/147* (2006.01)
*H01J 37/20* (2006.01)

(52) U.S. Cl.
CPC ........ *H01J 37/153* (2013.01); *H01J 37/1475* (2013.01); *H01J 37/20* (2013.01)

(58) Field of Classification Search
CPC .......... H01J 37/00; H01J 37/02; H01J 37/153; H01J 37/1475; H01J 37/20; H01J 37/05; H01J 2237/1532; H01J 2237/281

USPC ................................. 250/306, 307, 311, 397
See application file for complete search history.

(56) References Cited

U.S. PATENT DOCUMENTS

| 8,436,317 | B1* | 5/2013 | Chen | ..................... | H01J 49/288 |
|           |     |        |      |                      | 250/396 ML  |
| 2005/0017194 | A1* | 1/2005 | Matsuya | ............... | H01J 37/153 |
|           |     |        |      |                      | 250/396 R   |
| 2014/0077078 | A1* | 3/2014 | Hatakeyama | ...... | G01N 23/2251 |
|           |     |        |      |                      | 250/310     |
| 2017/0271121 | A1  | 9/2017 | Li et al. | | |

FOREIGN PATENT DOCUMENTS

| JP | S57147856 A | 9/1982 |
| JP | 2004342341 A | 12/2004 |
| JP | 201829089 A | 2/2018 |

OTHER PUBLICATIONS

Search Report mailed Jun. 4, 2019 in International Application No. PCT/JP2019/009527.
Written Opinion mailed Jun. 4, 2019 in International Application No. PCT/JP2019/009527.

* cited by examiner

*Primary Examiner* — Jason L McCormack
(74) *Attorney, Agent, or Firm* — Miles & Stockbridge, P.C.

(57) ABSTRACT

Deflection of a secondary beam, and astigmatism correction of a primary beam or of the secondary beam are carried out using a multi-pole electromagnetic deflector which deflects the path of the secondary beam toward a detector.

4 Claims, 6 Drawing Sheets

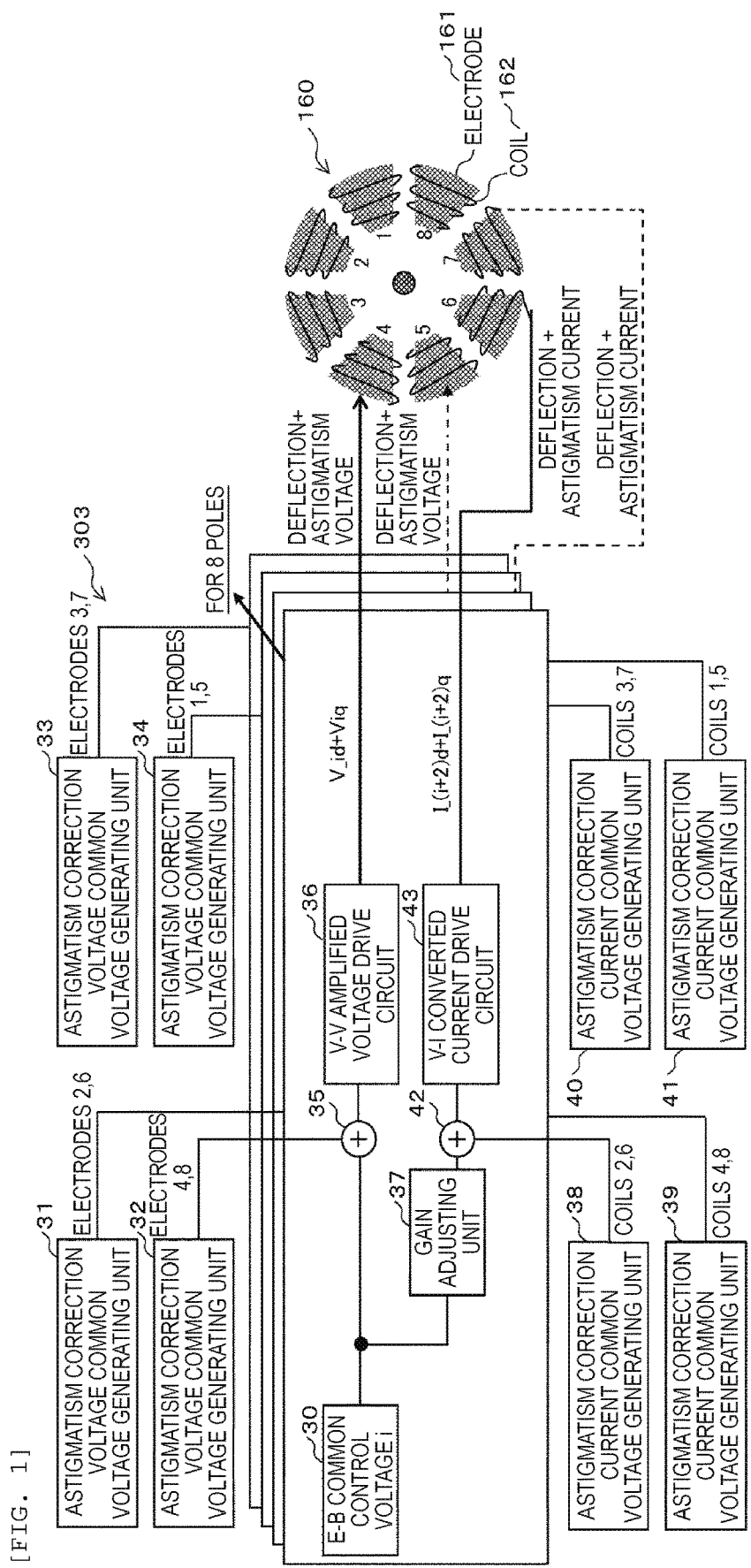

[FIG. 2]
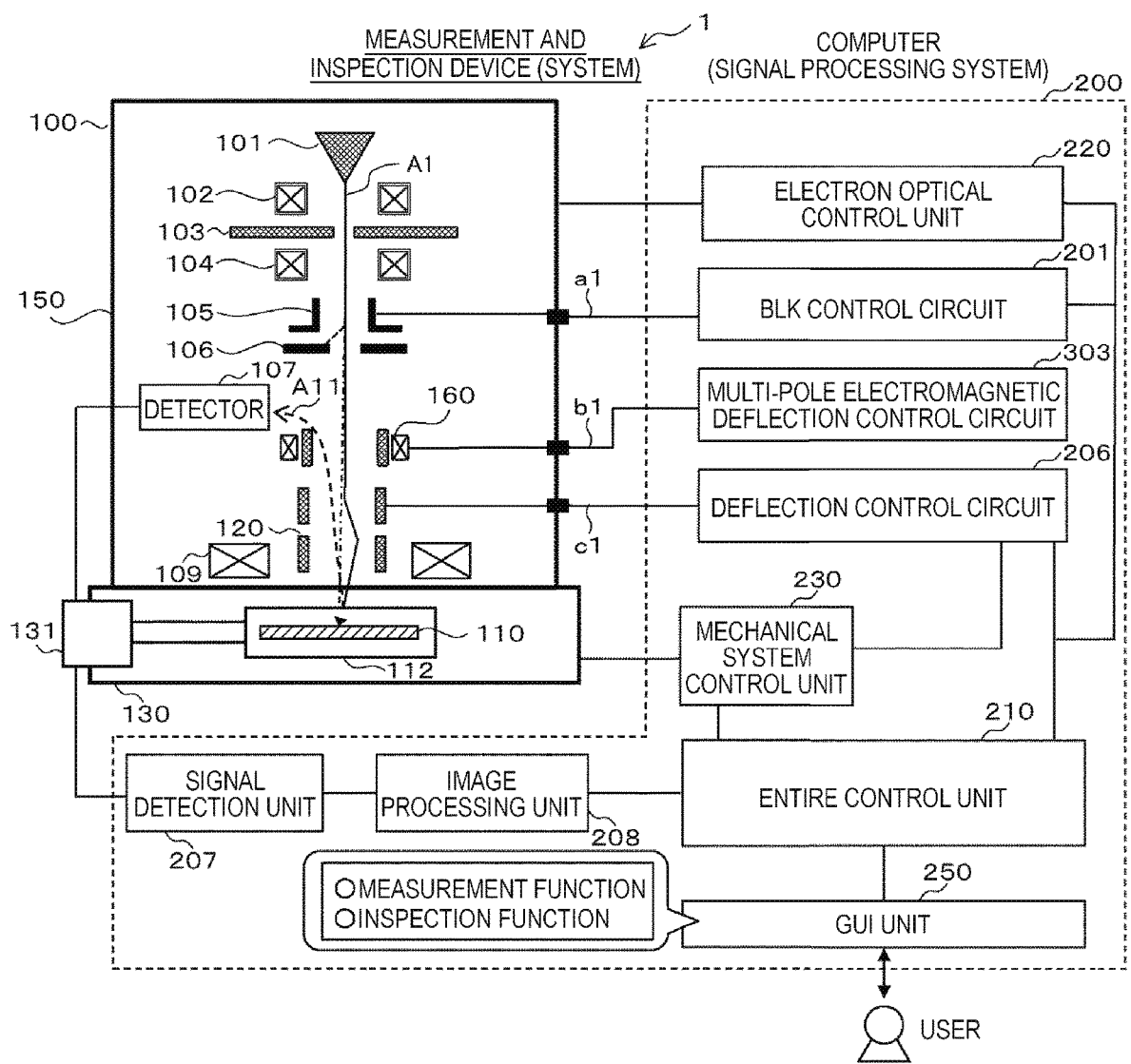

[FIG. 3]
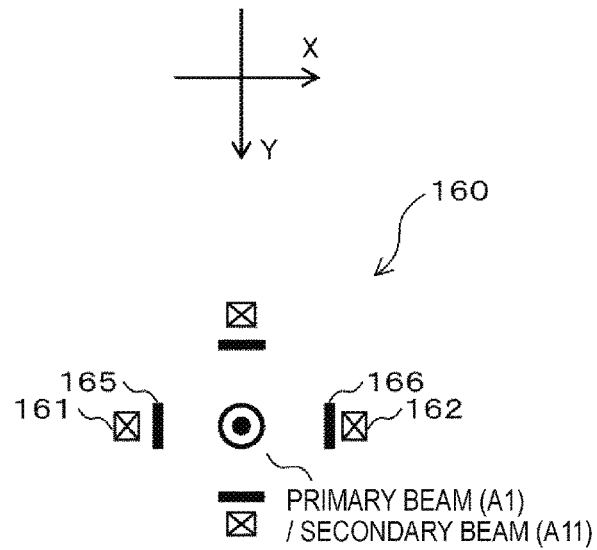
[FIG. 4]
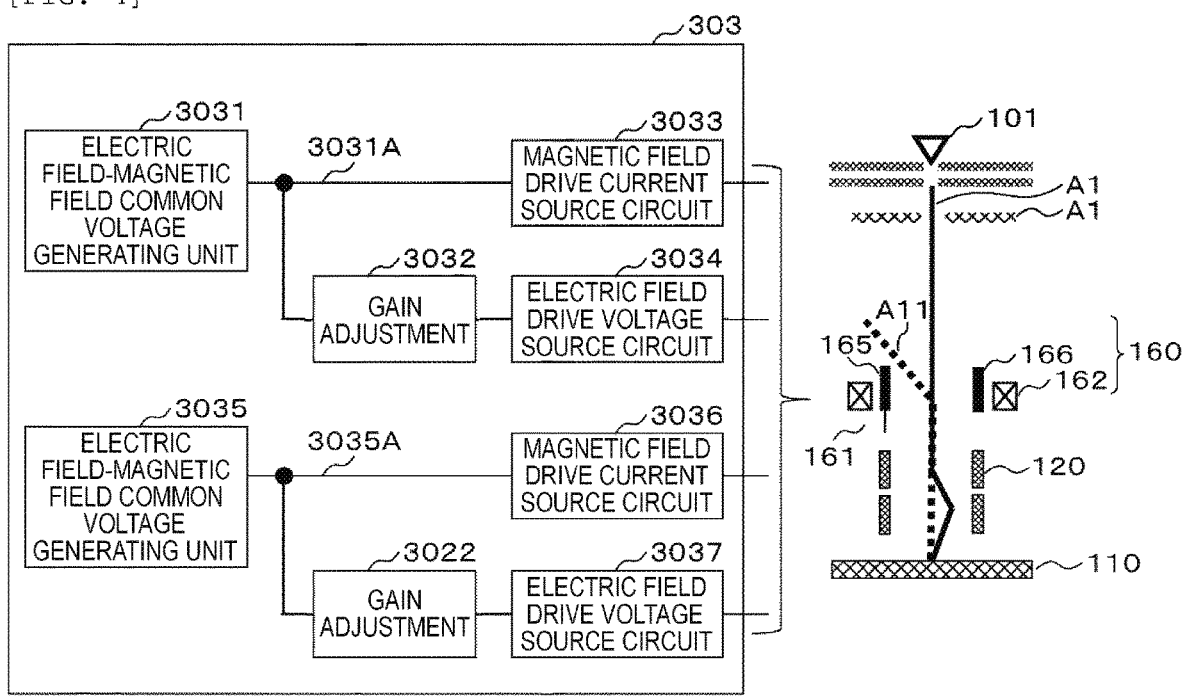

| POLE | | 1 | 2 | 3 | 4 | 5 | 6 | 7 | 8 |
|---|---|---|---|---|---|---|---|---|---|
| VOLTAGE | DEFLECTION | $-V$ | $-V(\sqrt{2}-1)$ | $+V(\sqrt{2}-1)$ | $+V$ | $+V$ | $+V(\sqrt{2}-1)$ | $-V(\sqrt{2}-1)$ | $-V$ |
| VOLTAGE | ASTIGMATISM | $+V_q$ | $-V_q$ | $-V_q$ | $+V_q$ | $+V_q$ | $-V_q$ | $-V_q$ | $+V_q$ |
| CURRENT | DEFLECTION | $+NI(\sqrt{2}-1)$ | $+NI$ | $+NI$ | $+NI(\sqrt{2}-1)$ | $-NI(\sqrt{2}-1)$ | $-NI$ | $-NI$ | $-NI(\sqrt{2}-1)$ |
| CURRENT | ASTIGMATISM | $-NI_q$ | $-NI_q$ | $+NI_q$ | $+NI_q$ | $-NI_q$ | $-NI_q$ | $+NI_q$ | $+NI_q$ |

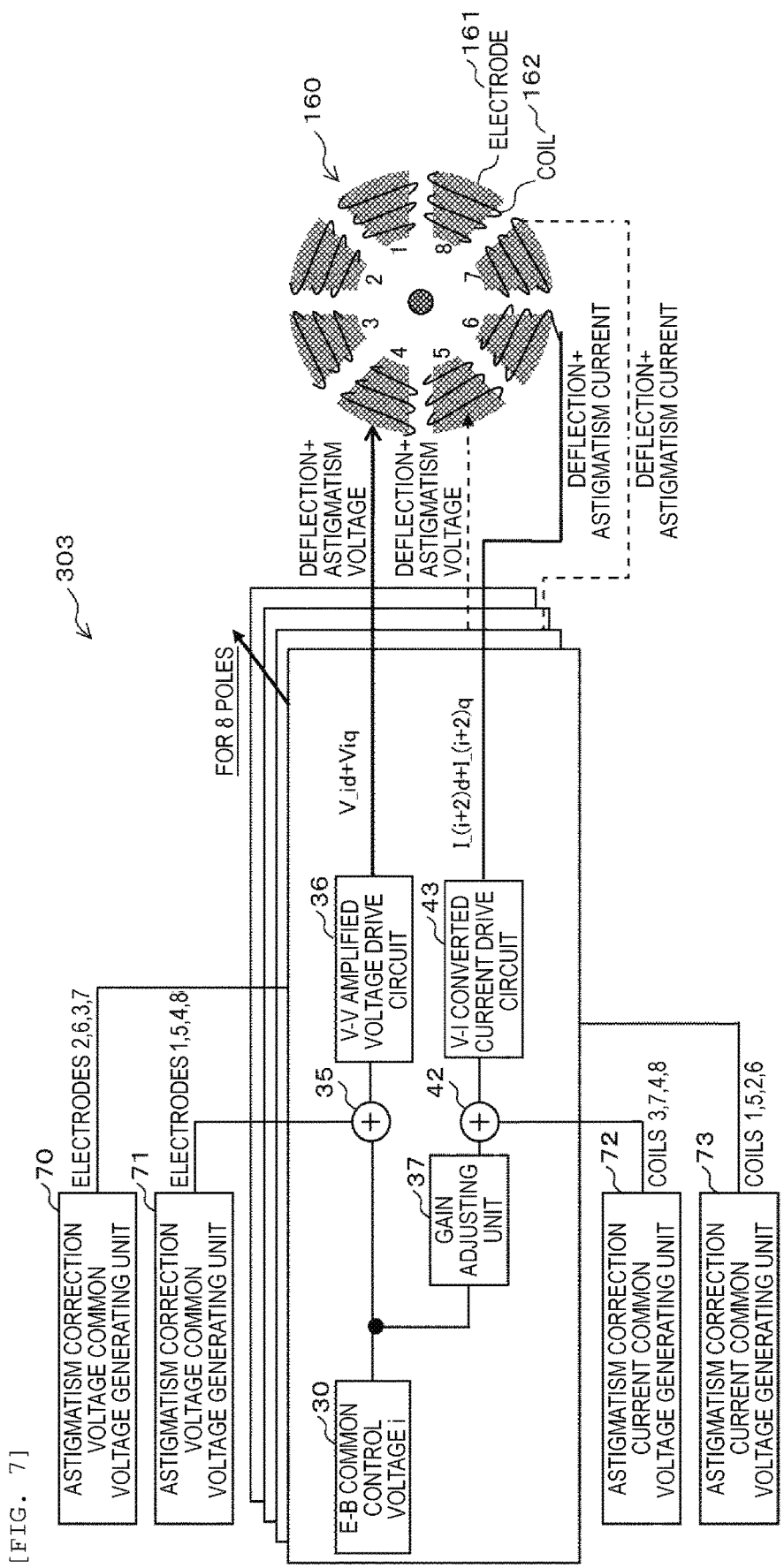
[FIG. 7]

CHARGED PARTICLE BEAM DEVICE

TECHNICAL FIELD

The present invention relates to a charged particle beam device.

BACKGROUND ART

In a semiconductor manufacturing process, the fineness of circuit patterns formed on a semiconductor substrate (wafer) is rapidly progressing, and the importance of process monitoring for monitoring whether the circuit patterns are formed as designed is increasing more and more. For example, in order to detect occurrence of an anomaly or defect (failure) in the semiconductor manufacturing process at an early stage or in advance, a circuit pattern or the like on a wafer is measured and inspected at the end of each manufacturing process.

At the measurement and inspection described above, in a measurement and inspection device such as SEM using a scanning electron beam system and a measurement and inspection method corresponding thereto, a sample such as a target wafer is irradiated with a primary electron beam (electron beam) while scanning the target wafer and energy such as secondary electrons and reflections generated by the irradiation is detected. Then, an image (measurement image or inspection image) is produced by signal processing, image processing, and the like based on the detection, and measurement, observation, or inspection is performed based on the image.

In the measurement device using the scanning electron beam system, in order to detect the secondary electrons and reflected electrons (secondary beam) generated from the sample with high efficiency, it is necessary to deflect the secondary electrons and reflected electrons toward a detector. On the other hand, when a unit that deflects the secondary beam in a predetermined direction influences the primary beam, an irradiation position deviation of the primary beam on the sample occurs and measurement accuracy of a device deteriorates. Therefore, a unit that separates the primary beam and the secondary beam, which deflects the secondary beam (secondary electrons and reflected electrons) in a direction in which the detector is installed and does not deflect the primary beam with which a predetermined position of the sample is irradiated, is required.

As an example of prior art related to the measurement and inspection and separation control of primary electron beam and secondary electron beam, there is a technique described in JP-A-2018-29089 (PTL 1).

CITATION LIST

Patent Literature

PTL 1: JP-A-2018-29089

SUMMARY OF INVENTION

Technical Problem

In a measurement device using the SEM, it is required to improve resolution of measurement accuracy and visibility of deep grooves and holes with the fineness of circuit patterns formed on a wafer to be measured and diversification of materials. In order to improve the resolution, it is required to improve scanning accuracy of the primary electron beam, that is, to reduce the scanning positional deviation of the primary beam.

In order to improve the visibility of deep grooves and deep holes, it is necessary to perform high-efficiency detection of the secondary beam. Therefore, a large angle deflection of the secondary beam is required. Here, when a large angular deflection is realized, a problem of wobbling of the primary beam caused by a high voltage and a large current occurs. High electric and high magnetic fields that require large angular deflection influence in-plane uniformity of a projected image of the secondary electron beam. Therefore, in order to realize such a large angular deflection and in-plane uniformity of the secondary beam, a secondary beam deflection unit having a multi-pole configuration capable of astigmatism correction is required.

PTL 1 describes a technique in which, by a secondary beam deflection unit having a multi-pole configuration (four-pole configuration), the secondary beam is deflected in any direction and the primary beam is made to travel straight without being subjected to a deflection action. However, PTL 1 does not describe a secondary beam deflection unit having a multi-pole configuration capable of astigmatism correction.

An object of the present invention is to simultaneously carry out deflection of a secondary beam and astigmatism correction of a primary beam and the secondary electron beam by a secondary beam deflection unit having a multi-pole configuration in a charged particle beam device.

Solution to Problem

A charged particle beam device according to an aspect of the present invention includes a charged particle gun that produces a primary beam, a stage on which a sample is placed, a detector that detects a secondary beam generated from the sample in response to the primary beam, a multi-pole electromagnetic deflector that deflects a path of the secondary beam, and a control circuit that controls the multi-pole electromagnetic deflector. Here, the multi-pole electromagnetic deflector includes electric field deflectors that generate an electric field, and magnetic field deflectors of which number is the same as the number of the electric field deflectors and which generate a magnetic field. Here, the control circuit includes the following: electric field deflector drive circuits, each driving the electric field deflector, a first astigmatism correction common voltage generating unit that controls the electric field deflector and outputs a first astigmatism correction voltage for carrying out astigmatism correction of the primary beam or the secondary beam, magnetic field deflector drive circuits, each driving the magnetic field deflector, a second astigmatism correction common voltage generating unit that controls the magnetic field deflector and outputs a second astigmatism correction voltage for carrying out astigmatism correction of the primary beam or the secondary beam, an electric field-magnetic field common control voltage generating unit that outputs a deflection common voltage for deflecting a path of the secondary beam to the detector to the electric field deflector drive circuit and the magnetic field deflector drive circuit, a first adder that adds the deflection common voltage and the first astigmatism correction voltage input directly or after adjustment and outputs a first added voltage to the electric field deflector drive circuit, and a second adder that adds the deflection common voltage and the second astigmatism correction voltage input directly or after adjustment and outputs a second added voltage to the magnetic field deflector drive circuit.

Advantageous Effects of Invention

According to one aspect of the present invention, in the charged particle beam device, the deflection of the secondary beam and the astigmatism correction of the primary and secondary electron beams can be carried out simultaneously by the secondary beam deflection unit having a multi-pole configuration.

BRIEF DESCRIPTION OF DRAWINGS

FIG. 1 is a diagram illustrating a configuration of a multi-pole electromagnetic deflection control circuit when a multi-pole electromagnetic deflector having an 8-pole configuration according to Example 1 is used.

FIG. 2 is a diagram illustrating a configuration of a measurement and inspection device of scanning electron beam system.

FIG. 3 is a diagram for describing a general separation and deflection action on a primary beam and a secondary beam by taking an orthogonal electromagnetic deflector having a multi-pole configuration (for example, a 4-pole configuration) as an example.

FIG. 4 is a diagram illustrating a configuration of a multi-pole electromagnetic deflector and its control circuit when a multi-pole electromagnetic deflector having a 4-pole configuration is used.

FIG. 7 is a diagram illustrating a configuration of a multi-pole electromagnetic deflection control circuit when a multi-pole electromagnetic deflector having an 8-pole configuration according to Example 2 is used.

DESCRIPTION OF EMBODIMENTS

Figure 5B:
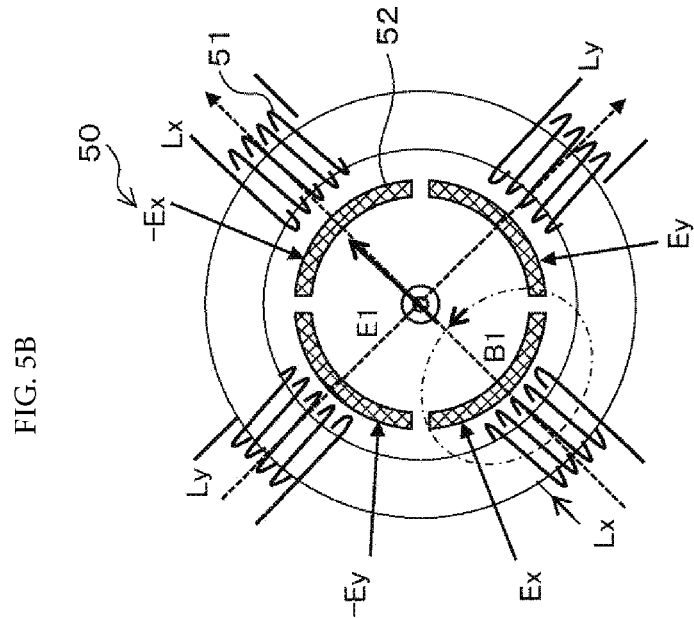
FIGS. 5A and 5B are diagrams for describing a configuration and deflection operation of the multi-pole electromagnetic deflector when the multi-pole electromagnetic deflector having the 8-pole configuration of Example 1 is used.

Hereinafter, examples will be described with reference to the drawings.

In a charged particle beam device, a multi-pole electromagnetic deflector (beam separator) that deflects a secondary beam of high energy at a large angle and separates the secondary beam from a primary beam is required in order to deal with deep grooves and holes and increase throughput. The multi-pole electromagnetic deflector is composed of an electric field deflector and a magnetic field deflector.

In order to realize large angular deflection, a configuration of a multi-pole electromagnetic deflector capable of generating a high electric field and a high magnetic field and a control circuit of the multi-pole electromagnetic deflector of high voltage and large current are required. However, when the large angular deflection is realized, the problem of primary beam wobbling caused by the high voltage and large current occurs. The multi-pole electromagnetic deflector has the role of deflecting the secondary beam and guiding the secondary beam to a detector. However, with the improvement of measurement accuracy, the wobbling of primary beam due to the electric field and the magnetic field has become a problem. High electric field and high magnetic field that require large angular deflection influence in-plane uniformity of a projected image of the secondary electron beam.

In order to realize such a large angular deflection and in-plane uniformity of the secondary beam, a multi-pole electromagnetic deflector (preferably 8 poles or more) capable of astigmatism correction is required. Then, in order to reduce astigmatism that influences the in-plane uniformity of the secondary beam, it is necessary to apply an astigmatism correction voltage and an astigmatism correction current to electrodes and coils of the multi-pole electromagnetic deflector. Here, a positional deviation of the primary beam occurs due to noise of the high voltage and large current for astigmatism correction and the deflection applied to the multi-pole electromagnetic deflector. Therefore, it is necessary to reduce the positional deviation of the primary beam.

In Example 1, a secondary beam deflection unit is provided in which an electromagnetic deflector that separates the primary beam and deflects the secondary beam is configured to have multiple poles (particularly, eight or more poles). The feature of such secondary beam deflection unit is that deflection of the secondary beam and astigmatism correction of the primary beam and the secondary beam are carried out simultaneously by adopting a multi-pole configuration (particularly, 8 poles or more).

Example 1

First, with reference to FIG. 2, a configuration of a measurement and inspection device (system) of scanning electron beam system, which is an example of the charged particle beam device, will be described.

[Measurement and Inspection Device (System)]

FIG. 2 illustrates a configuration of the entire system including the measurement and inspection device. A measurement and inspection device 1 in Example 1 is an application example that enables automatic measurement and automatic inspection of a target semiconductor wafer (sample 110). The measurement and inspection device 1 is provided with a measurement function for measuring a dimensional value in a circuit pattern of the semiconductor wafer (sample 110) and an inspection function for detecting defects (abnormality and failure) in the circuit pattern.

The measurement and inspection device (system) 1 is largely configured with a scanning electron microscope 100 and a computer 200 for signal processing and control.

The scanning electron microscope 100 includes a column 150 and a sample chamber 130, and a sample table (stage) 112 on which the sample 110, which is a target of measurement and inspection, is placed, and a motor 131 for driving a sample table are installed inside the sample chamber 130.

In the column 150 (vacuum) of the scanning electron microscope 100, as an irradiation system (electron optical system), an electron gun 101 that emits an electron beam A1, a focusing lens (first condenser lens) 102 through which the emitted electron beam A1 passes, a diaphragm 103, a focusing lens (second condenser lens) 104, a blanking (BLK) control electrode 105, an aperture 106, a deflector (electrode) 120, an objective lens 109, and the like are included.

The column 150 includes, as a detection system, a detector 107, which detects a secondary electron and reflected electron (secondary beam) A11 generated from the sample 110 by the emitted electron beam (primary beam) A1, and a multi-pole electromagnetic deflector 160 that deflects the secondary beam A11 toward the detector 107. Here, the multi-pole electromagnetic deflector 160 is an electromagnetic deflector that deflects the secondary beam A11 toward the detector 107 and carries out astigmatism correction of the primary beam A1 and the secondary beam A11.

The computer 200 is configured to be stored in a control rack in the form of a PC, a control board, or the like. Each part of the computer 200 is realized by, for example, software program processing by a processor, a memory, and the like, or processing of a dedicated circuit and the like.

The computer 200 includes an entire control unit 210, a blanking (BLK) control circuit 201, an image shift and deflection control circuit 206 that controls a position shift and deflection scanning of the electron beam, a mechanical system control unit 230, a signal detecting unit (secondary electron signal detecting circuit) 207, an image processing unit (secondary electron signal processing circuit) 208, a GUI unit (user interface unit) 250, and the like.

In the column 150 (vacuum) of the scanning electron microscope 100, the primary beam A1 produced and emitted from the electron gun 101 is focused through the first condenser lens (focusing lens) 102, the diaphragm 103, and the second condenser lens (focusing lens) 104 and is moved to the irradiation center of the beam via a deflector 120 that is scan-integrated with the image shift and is subjected to scanning deflection control, and is irradiated while scanning on the sample 110 via the objective lens 109 and the like. When the primary beam A1 is irradiated, the secondary beam A11 is generated from the sample 110 and detected by the detector 107. The signal (analog signal) detected by the detector 107 is converted into a digital signal by the signal detecting unit 207 (secondary electron signal detecting circuit). Then, based on the digital signal, a two-dimensional image is generated and processed by an image processing unit 208 (secondary electron signal processing circuit) and the two-dimensional image is displayed on the GUI screen. The circuit pattern is measured based on the image (in the case of the measurement function).

The GUI unit 250 performs a process of providing an interface (GUI screen or the like) to a user (measurer and inspector). The GUI unit 250 provides a GUI screen for inputting (setting) inspection conditions and the like, a GUI screen for displaying inspection results (two-dimensional images, and the like), and the like. The GUI unit 250 includes an input and output device such as a keyboard and a display, a communication interface unit, and the like. The user can select and execute the measurement function and the inspection function on the GUI screen.

The entire control unit 210 performs a process of controlling the entirety (electro-optical control unit 220, mechanical system control unit 230, image shift and deflection control circuit 206, signal detecting unit 207, image processing unit 208, stage position detecting unit, and the like) of the system (device) according to an instruction in the GUI unit 250. For example, the entire control unit 210 performs a measurement process by controlling the electro-optical control unit 220, the image shift and deflection control circuit 206, the mechanical system control unit 230, and the like according to measurement and inspection conditions and instructions input by the user on the screen of the GUI unit 250. For example, when the measurement is executed, the entire control unit 210 receives data information such as a two-dimensional image generated through the signal processing unit 207 and the image processing unit 208 and displays the data information on the screen of the GUI unit 250.

The electro-optical control unit 220 controls the electro-optical system (irradiation system) such as the electron gun 101, the first condenser lens (focusing lens) 102, the diaphragm 103, the second condenser lens (focusing lens) 104, the blanking control electrode 105, the objective lens 109, and the like in the column 100 according to the control from the entire control unit 210. The blanking control circuit 201 controls the blanking control electrode 105 via the signal line and bends a trajectory of the primary beam A1 to irradiate the aperture 106 with the primary beam A1 when the irradiation of the sample 110 with the primary beam A1 is stopped.

The image shift and deflection control circuit 206 shifts the position of the electron beam and controls scanning by deflection at the shifted position by applying a deflection control signal to the deflector 120 through a signal line c1, according to the control from the entire control unit 210

A multi-pole electromagnetic deflection control circuit 303 applies a secondary beam deflection control signal (for example, voltage or current) to the multi-pole electromagnetic deflector 160 that separates the primary beam and the secondary beam through a signal line b1, according to the control from the entire control unit 210. With such configuration, the secondary beam is deflected toward the detector 107, and control is performed to not influence the scanning direction of the primary beam.

However, in the multi-pole electromagnetic deflector 160, the problem of astigmatism correction occurs as described later. Therefore, the multi-pole electromagnetic deflection control circuit 303 applies an astigmatism correction control signal for carrying out astigmatism correction of the primary beam and the secondary beam to the multi-pole electromagnetic deflector 160 through the signal line b1, according to the control from the entire control unit 210. With such configuration, the multi-pole electromagnetic deflector 160 largely deflects the secondary beam and controls the astigmatism correction of the primary beam and the secondary beam.

In FIG. 2, the mechanical system control unit 230 controls a mechanical system including the motor 131 and the like for driving the sample table 112 installed in the sample chamber 130. For example, it is possible to drive the motor 131 in correspondence with the scanning control of the electron beam to control the movement of the sample table 112. Here, a rotation signal of the motor 131 is sent to a stage position detecting unit (not illustrated) to obtain position information of the sample table 112.

The computer 200 (entire control unit 210 and like) of FIG. 2 has both a measurement function and an inspection function, but may be provided with only one of the functions. In the case of measurement (measurement function), the image processing unit 208 generates a measurement image, calculates a pattern dimensional value in the image and the like, and in the case of inspection (inspection function), the image processing unit 208 generates an inspection image and performs a process of detecting and determining a defect in the image.

Next, referring to FIG. 3, a general separation and deflection action on the primary beam and the secondary beam will be described by taking a case where an electromagnetic deflector having a 4-pole configuration is used as the multi-pole electromagnetic deflector 160 in FIG. 2 as an example.

In a measurement and inspection device using a scanning electron beam system, for example, as a separation unit for the primary beam and the secondary beam, an orthogonal electromagnetic deflector having a multi-pole configuration in which a magnetic field generated by a current control coil and an electric field generated by voltage control are orthogonal to each other is adopted.

As illustrated in FIG. 3, the orthogonal electromagnetic deflectors are generally arranged in the X- and Y-directions, respectively, to deflect the secondary beam in any direction. For example, when a potential difference is applied between an electric field deflector 165 and an electric field deflector 166 facing thereto of the orthogonal electromagnetic deflector to generate an electric field, the primary beam A1 receives a force that deflects in the same direction as the electric field and is deflected by a predetermined angle. Here, the electric field deflector 166 and the electric field deflector 165 facing thereto is configured with electrodes, respectively.

When an exciting current is made to flow to a magnetic field deflector 161 and a magnetic field deflector 162 facing thereto of the orthogonal electromagnetic deflector, a magnetic field orthogonal to the electric field is generated, and the primary electric beam A1 is deflected in the opposite direction to the deflection due to the electric field. When the electric field and the magnetic field orthogonal to each other exist simultaneously, the trajectory of the primary beam is determined by a combination of the forces of the electric field and the magnetic field, and thus the primary beam is made to travel straight without being subjected to a deflection action. Here, each of the magnetic field deflector 161 facing the magnetic field deflector 162 is configured with a coil.

Meanwhile, since the secondary beam A11 generated from the sample 110 has a traveling direction opposite to that of the primary beam A1, the secondary beam A11 is deflected in the same direction in the electric field and the magnetic field, that is, toward the electrode side. An angle of deflection depends on energy of the secondary beam A11. Here, it is necessary to satisfy the condition (Wien condition) that the primary beam is not deflected. The Wien condition is a condition in which the electric field and magnetic field generated by the orthogonal electromagnetic deflector cancel the influence on the primary beam.

Next, with reference to FIG. 4, a configuration of the multi-pole electromagnetic deflection control circuit 303 when an electromagnetic deflector having a 4-pole configuration is used as the multi-pole electromagnetic deflector 160 of FIG. 2 will be described. In the configuration of the multi-pole electromagnetic deflection control circuit 303, the secondary beam A11 is subjected to the deflection action, but the primary beam A1 travels straight without being subjected to the deflection action.

The secondary beam A11 generated from the sample 110 by the irradiation of the primary beam A1 is detected by being deflected toward the detector 107 (see FIG. 2) by receiving a force from the magnetic field deflectors 161 and 162 and the electric field deflectors 165 and 166 configuring the multi-pole electromagnetic deflector 160 (see FIG. 2).

The deflection angle of the detected secondary beam A11 (see FIG. 3) is proportional to the strength of the electric field and magnetic field generated by the multi-pole electromagnetic deflector 160 and inversely proportional to energy of the secondary beam A11. The secondary beam A11 from the sample 110 is different in energy and incident onto the detector 107 whose mounting position is fixed. Therefore, magnitudes of the electric field and magnetic field generated by the multi-pole electromagnetic deflector 160 are controlled by an output voltage and output current of the multi-pole electromagnetic deflection control circuit 303.

Meanwhile, the output voltage of a voltage source circuit that controls the electric field and the output current of a current source circuit that controls the magnetic field satisfy the Wien condition so that the electric field and magnetic field generated by the multi-pole electromagnetic deflector 160 do not influence the scanning position of the primary beam A1.

The orthogonal electromagnetic deflection control circuit 303 generates a voltage value 3031A for determining the deflection angle of the secondary beam according to energy of the secondary beam A11 from an electric field-magnetic field common voltage generating unit 3031. The generated voltage value is converted into a current for controlling the magnetic field and amplified by a magnetic field drive current source circuit 3033, and applied to the magnetic field deflectors 171 and 172. Meanwhile, the voltage value 3031A is adjusted by a gain adjusting unit 3032, amplified to a voltage for controlling the electric field by the electric field drive voltage source circuit 3034, and applied to the electric field deflectors 175 and 176 so that the output voltage of the voltage source circuit that controls the electric field and the output current of the current source circuit that controls the magnetic field satisfy the Wine condition.

With such a configuration, a main portion of noise of the multi-pole electromagnetic deflection control circuit 303 that causes the positional deviation of the primary electron beam A1 becomes an in-phase component common to the electric field control circuit and the magnetic field control circuit. Then, the wobbling directions of the electric field and the magnetic field caused by the noise in the portion are opposite, and the magnitude thereof satisfies the Wine condition. The frequency characteristic and phase characteristic of the voltage source control signal match the frequency characteristic and phase characteristic of the current source control signal.

Therefore, in the deflection force to the primary beam A1 caused by common circuit noise of the multi-pole electromagnetic deflection control circuit 303, the noise portions of the electric field deflector and the magnetic field deflector can be canceled, and the positional deviation of the primary beam A1 can be reduced.

The frequency characteristic and the phase characteristic of each of the voltage source control signal and the current source control signal are matched. Therefore, in the deflection force to the primary beam A1 caused by the common circuit noise of the multi-pole electromagnetic deflection control circuit 303, the portions of the electric field deflector and the magnetic field deflector can cancel each other and the positional deviation of the primary beam A1 can be reduced.

However, in the configuration using the multi-pole electromagnetic deflector 160 having a 4-pole configuration illustrated in FIG. 4, it is not possible to control astigmatism correction of the primary beam A1 and the secondary beam A11 that occurs at the same that the multi-pole electromagnetic deflector 160 greatly deflects the secondary beam A11.

Therefore, in Example 1, by using the multi-pole electromagnetic deflector 160 having an 8-pole configuration, astigmatism correction of the primary beam A1 and the secondary beam A11 that occurs at the same that the multi-pole electromagnetic deflector 160 greatly deflects the secondary beam A11 is controlled.

Here, astigmatism correction (correction of astigmatism aberration) will be described.

When obtaining desired information from a sample by irradiating the sample with a beam, it is necessary to stably obtain a high-resolution image. In order to obtain the high-resolution image, it is necessary to focus the beam finely and keep a cross-sectional shape of the beam in a good circle shape (perfect circle).

However, astigmatism aberration occurs in the charged particle beam device due to factors such as a material of the lens, processing accuracy of the lens, and dirt on the lens. When astigmatism aberration occurs, not only the beam cannot be focused finely, but also a cross section of the beam becomes elliptical. The high-resolution image cannot be obtained with such a deformed beam. Therefore, astigmatism correction is required to correct the cross-sectional shape of the beam to a circle shape.

In Example 1, in order to control astigmatism correction of the primary beam A1 and the secondary beam A11, the multi-pole electromagnetic deflector 160 having the 8-pole configuration is used. Specifically, in a state where the beam passing through the center of the multi-pole electromagnetic deflector 106 configured with a group of 4N (N is a natural number) poles arranged at a constant division angle along the circumference, the cross section of the beam is corrected to a circle shape by generating a magnetic field and an electric field in a direction in which astigmatism aberration generated in the beam is canceled.

With reference to FIG. 1, the configuration of the multi-pole electromagnetic deflection control circuit 303 when the multi-pole electromagnetic deflector 160 having the 8-pole configuration according to Example 1 will be described.

Here, in FIG. 1, "d" means "deflection" and "q" means "astigmatism correction". i means pole numbers 1-8. Here, the pole is configured with an electrode and a coil. Vid means a deflection voltage applied to the electrode of an i-th pole. Viq means an astigmatism voltage applied to the coil of the i-th pole. I(i+2)d means a deflection current applied to the coil of an (i+2)-th pole. I (i+2) q means an astigmatism current applied to the coil of the (i+2)-th pole.

An electric field-magnetic field (E-B) common control voltage generating unit 30 generates and outputs Vid as a common voltage. The astigmatism correction voltage common voltage generating units 31, 32, 33, and 34 generate and output Viq as a common voltage. Then, Vid and Viq are added by an adder 35 and input to a V-V voltage amplified voltage circuit 36. The V-V voltage amplified voltage drive circuit 36 amplifies the voltage to generate (Vid+Viq) and applies the amplified voltage to an electrode 161 of the multi-pole electromagnetic deflector 160 having the 8-pole configuration.

The common voltage Vid generated by the E-B common control voltage generating unit 30 is input to a gain adjusting unit 37, and the gain adjusting unit 37 adjusts the gain and outputs V(i+2)d. The astigmatism correction current common voltage generating units 38, 39, 40, and 41 generate and output V(i+2)q as a common voltage. Then, V(i+2)d and V(i+2) q are added by an adder 42 to be input to a V-I conversion current drive circuit 43. The V-I conversion current drive circuit 43 converts a voltage into a current to generate (I(i+2)d+I(i+2)q) and applies the converted current to a coil 163 of the multi-pole electromagnetic deflector 160 having the 8-pole configuration.

As such, a deflection voltage and an astigmatism voltage are simultaneously applied to the electrode 161 of the pole. A deflection current and an astigmatism current are simultaneously applied to a coil 162 of the pole i. Here, the astigmatism correction voltage common voltage generating unit 31 corresponds to the electrodes 161 of poles 2 and 6. The astigmatism correction voltage common voltage generating unit 32 corresponds to the electrodes 161 of poles 4 and 8. The astigmatism correction voltage common voltage generating unit 33 corresponds to the electrodes 161 of poles 3 and 7. The astigmatism correction voltage common voltage generating unit 34 corresponds to the electrodes 161 of poles 1 and 5.

An astigmatism correction current common voltage generating unit 38 corresponds to the coils 162 of the poles 2 and 6. An astigmatism correction current common voltage generating unit 39 corresponds to the coils 162 of the poles 4 and 8. An astigmatism correction current common voltage generating unit 40 corresponds to the coils 162 of the poles 3 and 7. An astigmatism correction current common voltage generating unit 41 corresponds to the coils 162 of the poles 1 and 5.

Here, the "Wien condition" of each voltage and current that deflect the secondary beam is expressed by the following Equation 1.

$$I_{(i+2)d} = k_{(i+2)i} \times V_{id} \qquad [\text{Equation 1}]$$

The relationship between the voltage and the current of the electrode 161 and the coil 162 of the pole i for carrying out astigmatism correction on the primary beam A1 and the secondary beam A11 is as follows (Equation 2) to (Equation 5). That is, the astigmatism voltages of the opposing electrodes 161 are equal to each other. The astigmatism currents of the opposing coils 162 are equal to each other.

$$V_{2q} = V_{6q}, V_{3q} = V_{7q} \qquad [\text{Equation 2}]$$

$$V_{1q} = V_{5q}, V_{4q} = V_{8q} \qquad [\text{Equation 3}]$$

$$I_{2q} = I_{6q}, I_{3q} = I_{7q} \qquad [\text{Equation 4}]$$

$$I_{1q} = I_{5q}, I_{4q} = I_{8q} \qquad [\text{Equation 5}]$$

In the configuration of the multi-pole electromagnetic deflection control circuit device 303 when the multi-pole electromagnetic deflector 106 having the 8-pole configuration of Example 1 is used, the voltage for deflecting the secondary beam applied to each electrode 161 and the current applied to the coil 162 for deflecting the secondary beam arranged at a place 90 degrees offset from each electrode 161 are generated from the E-B common control voltage generating unit 30. For example, the voltage and current generated from the E-B common control voltage generating unit 30 are applied to the electrode 161 of the pole 1 and the coil 162 of the pole 3, the electrode 162 of the pole 2 and the coil 162 of the pole 4.

The astigmatism correction voltage applied to each electrode 161 is made the same as the astigmatism correction voltage applied to the electrode 161 arranged at opposite positions. Specifically, the astigmatism correction voltage common voltage generating unit 31 generates the same astigmatism correction voltage applied to the electrodes 161 of the poles 2 and 6. The astigmatism correction voltage common voltage generating unit 32 generates the same astigmatism correction voltage applied to the electrodes 161 of the poles 4 and 8. The astigmatism correction voltage common voltage generating unit 33 generates the same astigmatism correction voltage applied to the electrodes 161 of the poles 3 and 7. The astigmatism correction voltage common voltage generating unit 34 generates the same astigmatism correction voltage applied to the electrodes 161 of the poles 1 and 5.

A circuit configuration is provided such that the astigmatism correction current applied to each coil 162 is generated from the same common voltage as the astigmatism correction current applied to the coil 161 arranged at the opposite place. Specifically, the astigmatism correction current common voltage generating unit 38 generates a common voltage for the coils 162 of the poles 2 and 6 and applies the same astigmatism correction current to the coils 162 of the poles 2 and 6 via the V-I conversion current drive circuit 43. The astigmatism correction current common voltage generating unit 39 generates a common voltage for the coils 162 of the poles 4 and 8 and applies the same astigmatism correction current to the coils 162 of the poles 4 and 8 via the V-I conversion current drive circuit 43. The astigmatism correction current common voltage generating unit 40 generates a common voltage for the coils 162 of the poles 3 and 7 and applies the same astigmatism correction current to the coils 162 of the poles 3 and 7 via the V-I conversion current drive circuit 43. The astigmatism correction current common voltage generating unit 41 generates a common voltage for the coils 162 of the poles 1 and 5 and applies the same astigmatism correction current to the coils 162 of the poles 1 and 5 via the V-I conversion current drive circuit 43.

The voltage to be applied to each electrode 161 is a voltage which is amplified by the V-V voltage amplified voltage drive circuit 36 and output after the common control voltage Vid generated by the E-B common control voltage generating unit 30 and the astigmatism correction voltage Viq generated by the astigmatism correction voltage common voltage generating units 31, 32, 33, and 34 are combined by the adder 35.

The current to be applied to each coil 162 is a current which is converted by the V-I conversion current drive circuit 43 and output after the common control voltage V(i+2) d obtained by adjusting amplitude of the common control voltage Vid generated by the E-B common control voltage generating unit 30 by the gain adjusting unit 37 and the astigmatism correction current common voltage V(i+2) q generated by the astigmatic correction current common voltage generating units 38, 39, 40, and 41 are added by the adder 42.

Figure 5A:
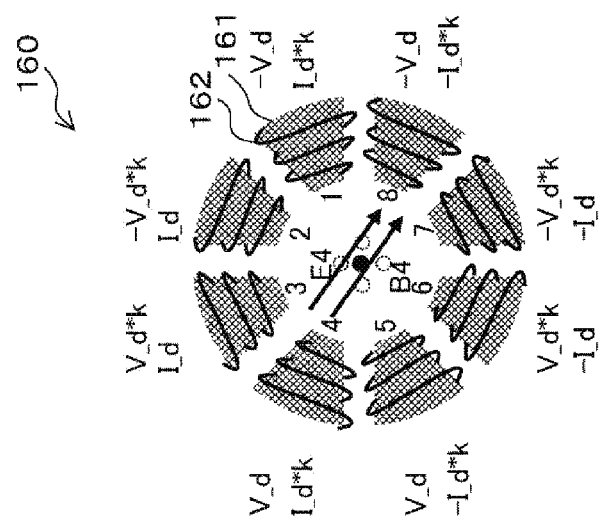
Figures 6A, 6B:
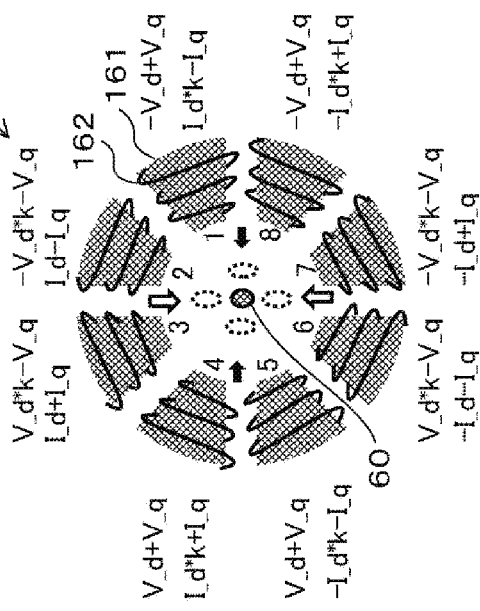
FIGS. 6A and 6B are diagrams for describing the configuration, the deflection operation, and an astigmatism correction operation of the multi-pole electromagnetic deflector when the multi-pole electromagnetic deflector having the 8-pole configuration of Example 1 is used.

Next, with reference to FIGS. 5A, 5B, 6A, and 6B, a configuration and operation of a multi-pole electromagnetic deflector (8 electromagnetic deflector) when the multi-pole electromagnetic deflector 160 having the 8-pole configuration of Example 1 is used will be described. Here, FIGS. 5A and 5B illustrate a deflection operation. FIGS. 6A and 6B illustrate a deflection operation and an astigmatism correction operation.

First, with reference to FIG. 5B, the configuration and deflection operation of the multi-pole electromagnetic deflector having a 4-pole configuration will be described.

In the case of the multi-pole electromagnetic deflector 50 having the 4-pole configuration, the direction of the magnetic field generated by the coils 51 arranged at the same place is perpendicular to the direction of the electric field generated by the electrodes 52 at the same place. As illustrated in FIG. 5B, an electric field E1 and a magnetic field B1 are generated to generate a force (one deflection vector) for deflecting the secondary beam. However, in the case of the multi-pole electromagnetic deflector 50 having the 4-pole configuration, this deflection force is weak, and thus it is necessary to arrange the detector 107 near the multi-pole electromagnetic deflector 50 having the 4-pole configuration.

Next, with reference to FIG. 5A, the configuration and deflection operation of the multi-pole electromagnetic deflector 160 having the 8-pole configuration will be described.

As illustrated in FIG. 5A, in the case of the multi-pole electromagnetic deflector 160 having the 8-pole configuration, the direction of the magnetic field generated by the coils 162 arranged at the same place is parallel to the direction of the electric field generated by the electrodes 161 at the same place.

As such, in the case of the multi-pole electric field deflector 50 having the 4-pole configuration (see FIG. 5B), the magnetic field generated by the coils 51 arranged at the same place is perpendicular to the direction of the electric field generated by the electrodes 52 at the same place. On the other hand, in the case of the multi-pole electric field deflector 160 having the 8-pole configuration (see FIG. 5A), the direction of the magnetic field generated by the coils 162 arranged at the same place is parallel to the direction of the electric field generated by the electrodes 161 at the same place.

As illustrated in FIG. 5A, in the case of the multi-pole electromagnetic deflector 160 having the 8-pole configuration, an electric field E4 and a magnetic field B4 are generated in the same direction. As a result, a large deflection force for deflecting the secondary beam A11 occurs. In the case of the multi-pole electromagnetic deflector 160 having the 8-pole configuration, the deflection force is strong and large angular deflection is carried out, and thus the detector 107 can be arranged at a place far from the multi-pole electromagnetic deflector 160 having the 8-pole configuration. Meanwhile, when the large angular deflection is carried out, the problem of astigmatism aberration of the primary beam A1 and the secondary beam A11 is likely to occur.

In Example 1, astigmatism correction of the primary beam A1 and the secondary beam A11 can carry out in a state where the secondary beam A11 is deflected in any direction at a large angle and the primary beam A1 is made to travel straight without being subjected to the deflection action. That is, in Example 1, in order to realize the large angular deflection and in-plane uniformity of the secondary beam A11, the multi-pole electromagnetic deflector 160 having the 8-pole configuration capable of astigmatism correction is used.

With reference to FIGS. 6A and 6B, the deflection operation and an astigmatism correction operation of the multi-pole electromagnetic deflector 160 having the 8-pole configuration will be described.

Here, in FIG. 6A, "d" means "deflection" and "q" means "astigmatism correction". "Vd" means a deflection voltage applied to the electrode 161. "Vq" means an astigmatism correction voltage applied to the electrode 161. "Id" means a deflection current applied to the coil 162. "Iq" means an astigmatism correction current applied to the coil 162. "*" means multiplication. "k" is a coefficient for adjusting the deflection direction of the secondary beam A11.

As illustrated in FIG. 6A, a coil 161 is arranged in the vicinity of or at the same position as an electrode 161, and astigmatism correction of the primary beam A1 and the secondary beam A11 is carried out by the electrodes 161 and the coil 162. In the case of Example 1, the electrodes 161 and the coils 162 configure eight poles 1 to 8. The eight poles 1 to 8 are arranged at a constant division angle on the circumference around an axis of trajectory of the primary beam A1 as the center.

FIG. 6A represents a state in which the shape of the beam before correction is corrected to a perfect circle of a beam spot 60 of the beam by the action of the electric field and magnetic field generated in the poles 1 to 8 by applying a voltage and a current set according to a composite vector. The shape of astigmatism aberration due to the magnetic field has a relationship of being rotated by 90° around the beam spot shape of the beam before correction of the aberration astigmatism as the axial center. As a result, the astigmatism aberration of the beam before correction is canceled, and the beam spot 60 having a perfect circle shape is obtained.

Specifically, four astigmatism correction vectors toward the center of the primary beam A1 and the secondary beam A11 occur. With the four astigmatism correction vectors, for example, the beam deformed into an ellipse is corrected to a circular beam, and the beam spot 60 having a perfect circle shape is obtained. That is, astigmatism correction is carried out on the primary beam A1 and the secondary beam A11.

In Example 1, the case where eight poles 1 to 8 are used for the correction of astigmatism aberration has been described, but even when the number of poles is 4, 12, 16, and the like, the astigmatism aberration of the beam can be corrected by the same technical method.

FIG. 6B is a table illustrating the relationship between the voltages and currents applied to poles 1 to 8.

As illustrated in FIG. 6B, a deflection voltage and an astigmatism correction voltage are simultaneously applied to each of the poles 1 to 8 as voltages. A deflection current and an astigmatism correction current are simultaneously applied to each of the poles 1 to 8 as currents.

Specifically, an electric deflection voltage −V and an astigmatism correction voltage +Vq are simultaneously applied to the pole 1 as voltages. A deflection current $+NI(\sqrt{2}-1)$ and an astigmatism correction current −NIq are simultaneously applied to each pole 1 as currents. Here, $(\sqrt{2}-1)$ is an example of the coefficient k for adjusting the deflection direction of the secondary beam.

An electric deflection voltage $-V(\sqrt{2}-1)$ and an astigmatism correction voltage −Vq are simultaneously applied to the pole 2 as voltages. A deflection current +NI and the astigmatism correction current −NIq are simultaneously applied to each pole 2 as currents.

The electric deflection voltage $+V(\sqrt{2}-1)$ and the astigmatism correction voltage −Vq are simultaneously applied to the pole 3 as voltages. The deflection current +NI and an astigmatism correction current +NIq are simultaneously applied to each pole 3 as currents.

An electric deflection voltage +V and the astigmatism correction voltage +Vq are simultaneously applied to the pole 4 as voltages. The deflection current $+NI(\sqrt{2}-1)$ and the astigmatism correction current +NIq are simultaneously applied to each pole 4 as currents.

The electric deflection voltage +V and the astigmatism correction voltage +Vq are simultaneously applied to the pole 5 as voltages. A deflection current $-NI(\sqrt{2}-1)$ and the astigmatism correction current −NIq are simultaneously applied to each pole 5 as currents.

The electric deflection voltage $+V(\sqrt{2}-1)$ and the astigmatism correction voltage −Vq are simultaneously applied to the pole 6 as voltages. A deflection current −NI and the astigmatism correction current −NIq are simultaneously applied to each pole 6 as currents.

The electric deflection voltage $-V(\sqrt{2}-1)$ and the astigmatism correction voltage −Vq are simultaneously applied to the pole 7 as voltages. The deflection current −NI and the astigmatism correction current +NIq are simultaneously applied to each pole 7 as currents.

The electric deflection voltage −V and the astigmatism correction voltage +Vq are simultaneously applied to the pole 8 as voltages. The deflection current $-NI(\sqrt{2}-1)$ and the astigmatism correction current +NIq are simultaneously applied to each pole 8 as currents.

Arranging the detector 107 near the multi-pole electromagnetic deflector 160 may be difficult for mounting reasons. A large angular deflection of the secondary beam A11 is carried out by using the multi-pole electromagnetic deflector 160 having the 8-pole configuration, and the detector 107 is arranged farther away. However, when the large angular deflection is carried out, the problem of astigmatism aberration of the primary beam A1 and the secondary beam A11 is likely to occur.

Therefore, in Example 1, astigmatism correction is carried out for the primary beam A1 and the secondary beam A11 in a state where the secondary beam A11 is deflected at a large angle in any direction and the primary beam A1 is made to travel straight without being subjected to the deflection action.

Specifically, in a state where the beam passing through the center of the multi-pole electromagnetic deflector 160 configured with groups of 8 poles 1 to 8 arranged at a constant division angle along the circumference, the electrodes 161 and the coils 162 of the multi-pole electromagnetic deflector 160 are caused to generate a magnetic field and an electric field in a direction in which astigmatism aberration generated in the beam is canceled. With such configuration, as illustrated in FIG. 6A, the cross section of the beam is corrected to a circle shape, and the beam spot 60 having a perfect circle shape is obtained.

Here, in Example 1, the multi-pole electromagnetic deflector having the 8-pole configuration is used as the multi-pole electromagnetic deflector 160, but, for example, in the case of the multi-pole electromagnetic deflector having the 4-pole configuration, the effect of astigmatism correction becomes insufficient and the accuracy becomes low. Therefore, when the multi-pole electromagnetic deflector having the 4-pole configuration is used, it is difficult to satisfy the requirement of deflecting the secondary beam A11 at a large angle and arranging the detector 107 farther away. Therefore, in Example 1, by using the multi-pole electromagnetic deflector 160 having the 8-pole configuration, the large angular deflection of the secondary beam A11 is carried out to satisfy the requirement of arranging the detector 107 farther.

As such, according to Example 1, astigmatism correction of the primary beam A1 and the secondary beam A11 can be carried out with high accuracy in a state where the secondary beam A11 is deflected in any direction at a large angle and the primary beam A1 is made to travel straight without being subjected to the deflection action.

Example 2

Next, with reference to FIG. 7, a configuration of the multi-pole electromagnetic deflection control circuit 303 when the multi-pole electromagnetic deflector 160 having the 8-pole configuration of Example 2 is used will be described.

Here, the difference from the multi-pole electromagnetic deflection control circuit 303 of Example 1 illustrated in FIG. 1 is that an astigmatism correction voltage common voltage generating unit 70 that applies an astigmatism correction voltage to the electrodes 161 of the poles 2, 6, 3, and 7, an astigmatism correction voltage common voltage generating unit 71 that applies an astigmatism correction voltage to the electrodes 161 of the poles 1, 5, 4, and 8, an astigmatism correction current common voltage generating unit 72 that applies an astigmatism correction current to the coils 162 of the poles 3, 7, 4, and 8, and an astigmatism correction current common voltage generating unit 73 that applies an astigmatism correction current to the coils 162 of the poles 1, 5, 2, and 6 are provided.

Specifically, as illustrated in FIG. 7, the E-B common control voltage generating unit 30 generates and outputs Vid as a common voltage. The astigmatism correction voltage common voltage generating units 70 and 71 generate and output Viq as a common voltage. Then, Vid and Viq are added by the adder 35 to be input to the V-V voltage amplified voltage drive circuit 36. The V-V voltage amplified voltage drive circuit 36 amplifies the voltage to generate Vid+Viq and applies the amplified voltage to the electrode 161 of the multi-pole electromagnetic deflector 160 having the 8-pole configuration.

The common voltage Vid generated by the E-B common control voltage generating unit 30 is input to the gain adjusting unit 37, and the gain adjusting unit 37 adjusts the gain and outputs V (i+2)d. The astigmatism correction current common voltage generating units 72 and 73 generate and output V(i+2)q as a common voltage. Then, V(i+2)d and V(i+2)q are added by the adder 42 to be input to the V-I conversion current drive circuit 43. The V-I conversion current drive circuit 43 converts a voltage into a current to generate I(i+2)d+I(i+2)q and applies the converted current to the coil 163 of the multi-pole electromagnetic deflector 160 having the 8-pole configuration. As such, the deflection voltage and the astigmatic voltage are simultaneously applied to the electrode 161 of a pole i. A deflection current and an astigmatic current are simultaneously applied to the coil 162 of the pole i.

Since other configurations and operations are substantially the same as those of the multi-pole electromagnetic deflection control circuit 303 of Example 1 illustrated in FIG. 1, the description thereof will be omitted.

According to Example 2, with a simpler circuit configuration, astigmatism correction of the primary beam A1 and the secondary beam A11 can be carried out with high accuracy in a state where the secondary beam A11 is deflected at a large angle in any direction and the primary beam A1 is made to travel straight without being subjected to a deflection action.

Although the invention made by the present inventors has been specifically described above based on the embodiments, it goes without saying that the present invention is not limited to the embodiments described above and can be variously modified without departing from the gist thereof.

[Summary and Variations]

As described above, the following has been described in the specification. Some items may be omitted in order to implement the embodiment.

A charged particle beam device including a charged particle gun that produces a primary beam, a stage on which a sample is placed, a detector that detects a secondary beam generated from the sample according to the primary beam, a multi-pole electromagnetic deflector that deflects a path of the secondary beam, and a control circuit that controls the multi-pole electromagnetic deflector is provided. The electron is an example of a charged particle.

The multi-pole electromagnetic deflector includes electric field deflectors (an electrode or an electrode that also serves as a core of a coil is an example thereof) that generate an electric field, and field deflectors (coil is an example thereof) of which number is the same as the number of the electric field deflectors and which generate a magnetic field.

The control circuit may include electric field deflector drive circuits (a circuit that outputs a voltage by receiving a voltage of, such as the V-V voltage amplified voltage drive circuit 36 in FIGS. 1 and 7 as an input is an example thereof, and another input and output may be used as long as a circuit that makes the electric field deflector act), each driving the electric field deflector, a first astigmatism correction common voltage generating unit (it may be an output other than the voltage as an output of, such as the astigmatic correction voltage common voltage generating units 31 to 34 in FIGS. 1 and 7) that controls the electric field deflector and outputs a first astigmatism correction voltage for carrying out astigmatism correction of the primary beam or the secondary beam, magnetic field deflector drive circuits (a circuit that outputs a current by receiving a voltage of, such as the conversion current drive circuit 43 in FIGS. 1 and 7 as an input is an example thereof, and another input and output may be used as long as a circuit that makes the electric field deflector act), each driving the magnetic field deflector, a second astigmatism correction common voltage generating unit (it may be an output other than the voltage as an output of, such as the astigmatic correction voltage common voltage generating units 38 to 41 in FIGS. 1 and 7) that controls the magnetic field deflector and outputs a second astigmatism correction voltage for carrying out astigmatism correction of the primary beam or the secondary beam, an electric field-magnetic field common control voltage generating unit (the output may be other than voltage) that outputs a deflection common voltage for deflecting a path of the secondary beam to the detector to the electric field deflector drive circuit and the magnetic field deflector drive circuit, a first adder that adds the deflection common voltage and the first astigmatism correction voltage input directly or after adjustment and outputs a first added voltage to the electric field deflector drive circuit, and a second adder that adds the deflection common voltage and the second astigmatism correction voltage input directly or after adjustment and outputs a second added voltage to the magnetic field deflector drive circuit.

An example of the adder is an operational amplifier or a unit that combines an A/D convertor, a D/A convertor, and a CPU, but other circuits or units may be used as long as inputs can be added and output.

The electric field deflectors and the magnetic field deflectors may be arranged circumferentially (for example, the circumference as illustrated in FIGS. 1 and 7, or the periphery of a regular polygon, or the outer circumference of a line-symmetrical or point-symmetrical figure).

The deflection common voltage may be a direct or adjusted input of a predetermined first adder corresponding to a predetermined electric field deflector and a predetermined second adder corresponding to a predetermined magnetic field deflector arranged at a position offset 90 degrees clockwise or counterclockwise from the predetermined electric field deflector.

The charged particle beam device may be as follows: when each of the number of electrodes and the number of coils included in the multi-pole electromagnetic deflector is N (but, N is an even number of 8 or more), the control circuit includes: a plurality of drive circuits for electrodes for driving the electrodes, a plurality of adders for electrodes, a plurality of drive circuits for coils for driving the coil, a plurality of adders for coils, a plurality of electric field-magnetic field common control voltage generating units, a plurality of astigmatism correction common voltage generating units for electrodes, and a plurality of astigmatism correction common voltage generating units for coils. Each of the number of the drive circuits for electrodes, the number of the adders for electrodes, the number of the drive circuits for coils, the number of the adders for coils, and the number of the electric field-magnetic field common control voltage generating units included in the control circuit is N. Each of the number of astigmatism correction common voltage generating units for electrodes and the number of astigmatism correction common voltage generating units for coils included in the control circuit, is N/G (but, G is an even number of 2 or more). In the configuration of FIG. 1, G is 2, and in the configuration of FIG. 7, G is 4, but any other even number may be used as long as it is an even number of 2 or more.

Here, when an i-th (assuming to start from the first) component among a plurality of virtual or physical components included in the charged particle beam device is expressed as a component[i]: (A) an electrode[n], a drive circuit for electrode[n], and an adder for electrode[n] are in 1:1:1 correspondence (where n is a natural number of N or less), (B) a coil [c], a drive circuit for coil [c], and an adder for coil [c] are in 1:1:1 correspondence (but, c is a natural number less than or equal to N and has a 1:1 correspondence relationship with n), (C) an electric field-magnetic field common control voltage generating unit[n] outputs a first voltage[n] to the adder for electrode[n] and the adder for coil[c], (D) an astigmatism correction common voltage generating unit for electrode[j] outputs a second voltage[j] to at least an adder for electrode[j] and an adder for electrode [1+((j−1+N/2) Mod N)] (but, j is a natural number less than or equal to N/G), and (E) a coil astigmatism correction common voltage generating unit[k] outputs a third voltage [k] to at least an adder for coil[k] and an adder for coil[1+((k−1+N/2) Mod N)] (but, k is a natural number less than or equal to N/G). A Mod B refers to an operator for finding the remainder when A is divided by B. A natural number refers to an integer starting from 1.

The plurality of electrodes may be arranged around the space through which the primary beam passes, and the electrode[n] may be arranged next to the electrode[(n+1) Mod N]. The plurality of the coils may be arranged around the space through which the primary beam passes, and the coil[c] may be arranged next to the coil[(c+1) Mod N].

In addition to being arranged between the electric field-magnetic field common control voltage generating unit and the drive circuit for coil (or adder for coil), the gain adjusting unit in FIGS. 1 and 7 may be arranged between the electric field-magnetic field common control voltage generating unit and the drive circuit for electrode (or adder for electrode). The gain adjusting unit may also be arranged between the astigmatism correction common voltage generating unit and each drive circuit. Gain adjustment of the gain adjusting unit may consider frequency filtering as a part of the adjustment, except when a value obtained by multiplying the input by a predetermined magnification is output.

A part or all of the control circuit may be a digital circuit.

Preferably, the matters described above hold even if the first of each of the electrodes, drive circuits for electrode, adders for electrodes, coils, drive circuits for coils, adders for coils, electric field-magnetic field common control voltage generating units, astigmatism correction common voltage generating units for electrodes, astigmatism correction common voltage generating units for coils, and gain adjusting units is selected from the respective types of components. However, the matters described above may hold when a specific component is set as the first.

Finally, in the above examples, although the case of using the multi-pole electromagnetic deflector having the 8-pole configuration has been described, the present invention is not limited to thereto, a multi-pole electromagnetic deflector having a 4-pole configuration with 4 poles, a multi-pole electromagnetic deflector having a 12-pole configuration with 12 poles, and a multi-pole electromagnetic deflector having a 16-pole configuration with 16 poles. That is, the present invention can be applied to a multi-pole electromagnetic deflector having a configuration with 4N (N is a natural number) poles. The present invention is also applicable to a multi-beam device using a multi-beam.

REFERENCE SIGNS LIST

1: measurement and inspection device (system)
30: electric field-magnetic field (E-B) common control voltage generating unit
31: astigmatism correction voltage common voltage generating unit
32: astigmatism correction voltage common voltage generating unit
33: astigmatism correction voltage common voltage generating unit
34: astigmatism correction voltage common voltage generating unit
35: adder
36: V-V voltage amplified voltage drive circuit
37: gain adjusting unit
38: astigmatism correction current common voltage generating unit
39: astigmatism correction current common voltage generating unit
40: astigmatism correction current common voltage generating unit
41: astigmatism correction current common voltage generating unit
42: adder
43: V-I conversion current drive circuit
70: astigmatism correction voltage common voltage generating unit
71: astigmatism correction voltage common voltage generating unit
72: astigmatism correction current common voltage generating unit
73: astigmatism correction current common voltage generating unit
100: scanning electron microscope (column)
101: electron gun
102: first condenser lens (focusing lens)
103: diaphragm
104: second condenser lens (focusing lens)
105: blanking (BLK) control electrode
106: aperture
107: detector (secondary electron and reflected electron detector)
109: objective lens
110: sample
112: sample stand (stage)
120: deflector
160: multi-pole electromagnetic deflector
200: computer (signal processing system)
201: blanking (BLK) control circuit
206: image shift and deflection control circuit 207: signal detecting unit (secondary electron signal detecting circuit)
208: image processing unit (secondary electron signal processing circuit)
210: entire control unit
220: electro-optical control unit
230: mechanical system control unit
250: GUI unit
303: multi-pole electromagnetic deflection control circuit

The invention claimed is:

1. A charged particle beam device comprising:
a charged particle gun that produces a primary beam;
a stage on which a sample is placed;
a detector that detects a secondary beam generated from the sample in response to the primary beam;
a multi-pole electromagnetic deflector that deflects a path of the secondary beam; and
a control circuit that controls the multi-pole electromagnetic deflector, wherein
the multi-pole electromagnetic deflector includes
electric field deflectors that generate an electric field, and
magnetic field deflectors of which number is the same as the number of the electric field deflectors and which generate a magnetic field,
the control circuit includes
electric field deflector drive circuits, each driving the electric field deflector,
a first astigmatism correction common voltage generating unit that controls the electric field deflector and outputs a first astigmatism correction voltage for carrying out astigmatism correction of the primary beam or the secondary beam,
magnetic field deflector drive circuits, each driving the magnetic field deflector,
a second astigmatism correction common voltage generating unit that controls the magnetic field deflector and outputs a second astigmatism correction voltage for carrying out astigmatism correction of the primary beam or the secondary beam,
an electric field-magnetic field common control voltage generating unit that outputs a deflection common voltage for deflecting a path of the secondary beam to the detector to the electric field deflector drive circuit and the magnetic field deflector drive circuit,
a first adder that adds the deflection common voltage and the first astigmatism correction voltage input directly or after adjustment and outputs a first added voltage to the electric field deflector drive circuit, and
a second adder that adds the deflection common voltage and the second astigmatism correction voltage input directly or after adjustment and outputs a second added voltage to the magnetic field deflector drive circuit.

2. The charged particle beam device according to claim 1, wherein
each of the number of the electric field deflectors and the number of the magnetic field deflectors of the multi-pole electromagnetic deflector is N (but, N is a multiple of 4 which is 8 or more).

3. The charged particle beam device according to claim 2, wherein
the electric field deflectors are arranged circumferentially,
the magnetic field deflectors are arranged circumferentially, and
the deflection common voltage is a direct or adjusted input of a predetermined first adder corresponding to a predetermined electric field deflector, and a predetermined second adder corresponding to a predetermined magnetic field deflector arranged at a position offset 90 degrees clockwise or counterclockwise from the predetermined electric field deflector.

4. The charged particle beam device according to claim 3, wherein
the electric field deflector is an electrode, and
the magnetic field deflector is a coil in which the electrode is at least part of a core.

* * * * *